(12) United States Patent
Takeuchi et al.

(10) Patent No.: US 7,982,937 B2
(45) Date of Patent: Jul. 19, 2011

(54) MICRO MIRROR UNIT AND ITS MANUFACTURING PROCESS, AND OPTICAL SWITCH WITH THE MICRO MIRROR UNIT EMPLOYED THEREIN

(75) Inventors: Shinichi Takeuchi, Kawasaki (JP); Tsuyoshi Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1499 days.

(21) Appl. No.: 10/953,619

(22) Filed: Sep. 28, 2004

(65) Prior Publication Data
US 2007/0041682 A1    Feb. 22, 2007

(51) Int. Cl.
*G02B 26/08* (2006.01)
(52) U.S. Cl. .................................................. 359/224.1
(58) Field of Classification Search .... 359/223.1–226.1; 250/216
See application file for complete search history.

(56) References Cited

U.S. PATENT DOCUMENTS

| 6,044,705 A | 4/2000 | Neukermans et al. |
| 6,366,414 B1 | 4/2002 | Aksyuk et al. |
| 6,392,220 B1 * | 5/2002 | Slater et al. ............... 250/216 |

FOREIGN PATENT DOCUMENTS

| EP | 1 193 527 A2 | 4/2002 |
| WO | WO 00/20899 | 4/2000 |

OTHER PUBLICATIONS

D.T. Neilson et al. Fully Provisioned 112×112 Micro-Mechanical Optical Crossconnect with 35.8Tb/s Demonstrated Capacity. Optical Fiber Communications Conference (OFC 2000) Postdealine Paper PD-12.

* cited by examiner

*Primary Examiner* — Euncha P Cherry
(74) *Attorney, Agent, or Firm* — Fujitsu Patent Center

(57) ABSTRACT

The micro mirror unit includes a substrate, on which are provided a micro mirror reflecting light, a torsion bar supporting the micro mirror, a frame rotatably supporting the torsion bar, and a deformative supporting part which deforms itself to lift the frame away from the substrate and supports the frame in such a lifted condition. This arrangement makes it possible to realize an increased space between the micro mirror and the substrate, thereby realizing an enlarged mirror tilt angel, without increasing the thickness of the sacrifice layer.

19 Claims, 10 Drawing Sheets

FIG. 5A
FIG. 5B
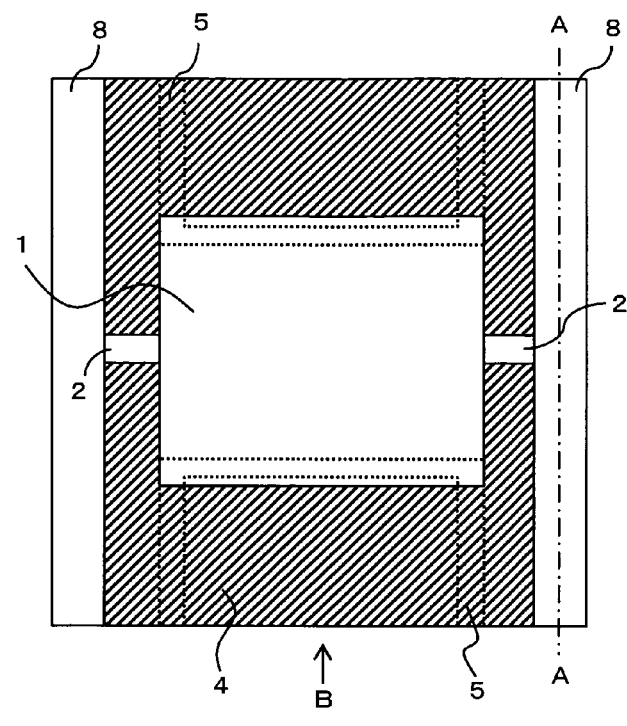
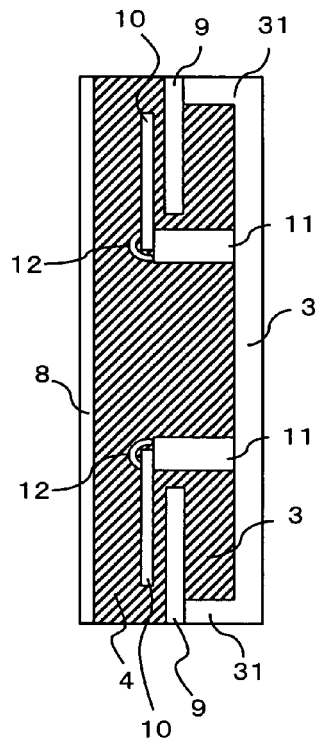
FIG. 5C
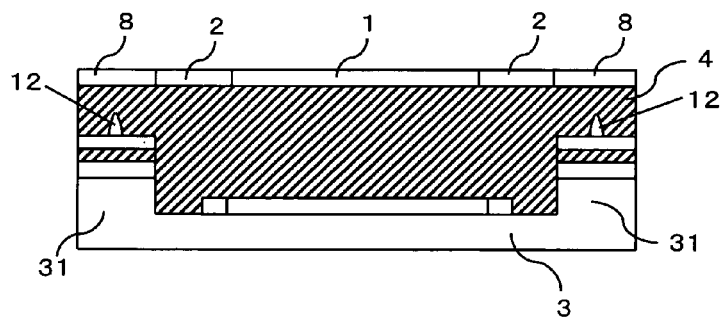

FIG. 7A
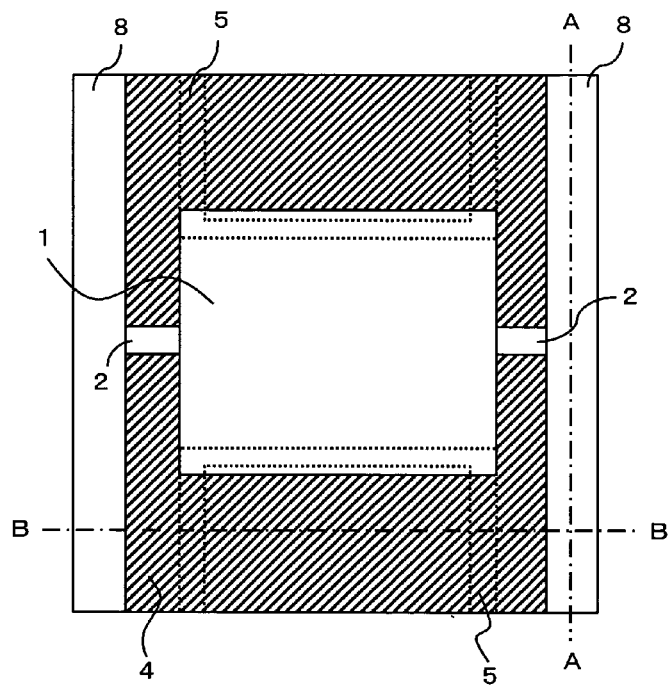
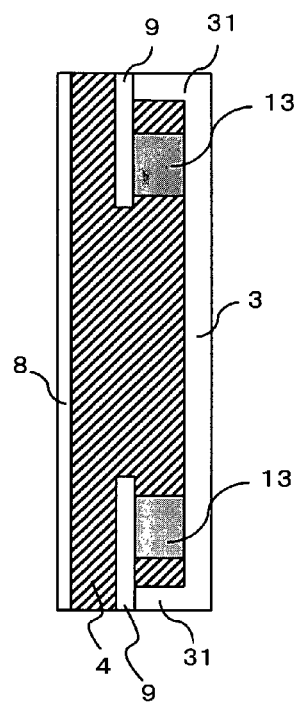
FIG. 7B
FIG. 7C
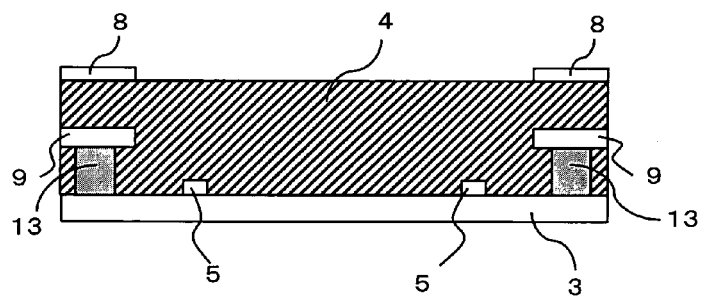

MICRO MIRROR UNIT AND ITS MANUFACTURING PROCESS, AND OPTICAL SWITCH WITH THE MICRO MIRROR UNIT EMPLOYED THEREIN

CROSS REFERENCE TO RELATED APPLICATIONS

This application is based on and hereby claims priority to PCT International Application No. PCT/JP2002/006229 filed on Jun. 21, 2002, the contents of which are hereby incorporated by reference.

BACKGROUND OF THE INVENTION (1) Field of the Invention

The present invention relates to micro mirror technology using MEMS (Micro Electro Mechanical Systems). The invention relates particularly to micro mirror units suitable for use in large-scale channel switching (crossconnect) for wavelength division multiplex signals with multiple wavelengths (channels), and to the manufacturing process for the micro mirror units. Further, the invention also relates to an optical switch with such micro mirror units employed therein.

(2) Description of Related Art

With recent speeding up of optical signals transmitted over backborn networks, it is necessary for optical switches such as optical crossconnect devices to support very high-speed optical signals as fast as 10 Gbps (Gigabits per second). In addition, with increases in the number of channels transmitted in WDM (Wavelength Division Multiplex) systems, the scale of switching has been becoming extremely large.

Against this backdrop, optical switches employing micro tilt mirror arrays with MEMS have been developed for use as large-scale optical switches. Such example optical switches are proposed in the article, "D. T. Neilson, et al., '*Fully provisioned* 112×112 *micro-mechanical optical crossconnect with* 35.8*T b/s demonstrated capacity*,' Optical Fiber Communications Conference (OFC 2000), Postdeadline paper PD-12, March 2000", and in International Patent Publication No. WO 00/20899. Further, MEMS micro tilt mirrors disclosed in U.S. Pat. No. 6,044,705 are well known.

Now, a description will be made of MEMS micro tilt mirrors.

FIG. 9A schematically shows a top view of a MEMS micro tilt mirror (unit); FIG. 9B shows a side view on arrow A of FIG. 9A. As shown in FIG. 9A and FIG. 9B, the micro tilt mirror includes a bottom substrate (hereinafter will be simply called the "substrate") 3 with the shape of a letter U (with walls 31 and 32) in the side view on arrow A, on which substrate 3 there are arranged a micro mirror (hereinafter will be simply called the "mirror") 1, torsion bars 2, which are integrated with the mirror 1, and electrodes 5. The torsion bars 2 are rotatably supported by the walls 31 and 32 of the substrate 3.

As shown in FIG. 9B, this arrangement provides a space between the mirror 1 and the substrate 3 with a height equal to the height of the walls 31 and 32. By applying a specific voltage to the electrodes 5, an electromagnetic force is generated at the electrodes 5 so as to turn the mirror 1 about the torsion bar 2. A micro tilt mirror with such a construction is manufactured as follows. (1) Electrodes 5 are formed on the substrate 3 by etching or the like. (2) After a sacrifice layer 4 of silicon oxide ($SiO_2$) resin or the like is formed on the electrodes 5 and the substrate 3, (3) a mirror 1 and torsion bars 2 are formed on the sacrifice layer 4 by etching. (4) The sacrifice layer 4 is finally removed by wet etching with use of a predetermined removal agent.

In large-scale optical switches employing such micro tilt mirrors, the greater the number of channels to be subjected to switching is, the greater the required turn angles (tilt angles) of mirrors 1. Here, the tilt angle of each mirror 1 can be enlarged by increasing the height (distance) between the substrate 3 and the mirror 1. However, as shown in FIG. 10, since the distance between the mirror 1 and the substrate 3 depends on the thickness 7 of the sacrifice layer 4, which is formed between the electrode 5 and mirror 1 during the manufacturing process, the thickness 7 of the sacrifice layer 4 needs to be increased so as to enlarge the tilt angle of the mirror 1.

Hence, in previous arts, the thickness 7 of the sacrifice layer 4 is increased to realize an increased height between the substrate 3 and the mirror 1. However, the increased thickness 7 makes it difficult to completely remove the sacrifice layer 4 by a wet etching method, so that some part (remaining sacrifice layer) 6 of the sacrifice layer 4 is left unremoved as shown in FIG. 9A and FIG. 9B. This means that the mirror 1, the substrate 3, and the electrodes 5, are fixed to one another, thereby making it impossible for the mirror 1 to operate. In such cases, the thickness of the sacrifice layer 4 cannot be increased, mirror tilt angles are resultantly limited, and yields are deteriorated.

With the foregoing problems in view, one object of the present invention is to provide micro mirror units with enlarged mirror tilt angles, without increasing the thickness of the sacrifice layer. Another object of the invention is to provide a method for manufacturing the micro mirror units. A further object of the invention is to provide optical switches with the micro mirror units employed therein.

SUMMARY OF THE INVENTION

In order to accomplish the above object, according to the present invention, there is provided a micro mirror unit, comprising: a substrate; on the surface of the substrate, a micro mirror reflecting light; a torsion bar supporting the micro mirror; a frame rotatably supporting the torsion bar; and a deformative supporting part which deforms itself to lift the frame away from the substrate, the deformative supporting part supporting the frame in such a lifted condition.

In the micro mirror unit of the present invention, since the deformative supporting part deforms itself to lift the frame, which rotatably supports the torsion bar, away form the substrate, it is possible to give the micro mirror an enlarged tilt angle, without increasing the thickness of the sacrifice layer during the manufacturing process. It is thus possible to provide a micro tilt mirror having a desired mirror tilt angle, while avoiding deterioration in yields and also avoiding operation failure caused by remains of the sacrifice layer.

The above micro mirror unit is manufactured in the following manufacturing process, comprising:

(1) forming, on a substrate, a resin layer with plasticity and a sacrifice layer with a specific thickness;

(2) forming, on the sacrifice layer, a micro mirror reflecting light, a torsion bar supporting the micro mirror, and a frame rotatably supporting the torsion bar; and (3) removing the sacrifice layer to deform the resin layer so that the resin layer lifts the frame away from the substrate and supports the frame in such a lifted condition.

As a preferred feature, the deformative supporting part includes a spring board member which contracts and deforms to warp itself so as to lift the frame away from the substrate, the spring board member supporting the frame in such a lifted condition. As another preferred feature, the deformative supporting part includes an expansive member which expands and deforms so as to lift the frame away from the substrate, the expansive member supporting the frame in such a lifted condition. In any of the cases, it is possible to realize the aforementioned lifting and supporting of the frame with a simple construction.

As still another preferred feature, either one or both of the frame and the spring board member have a positioning mechanism formed thereon, the positioning mechanism being operative to secure the frame at a position apart from the substrate by a specific distance. This makes it easy to control the distance between the frame and the substrate.

As a further preferred feature, the positioning mechanism is a combination of a hole formed on the frame and a protrusion formed on the spring board member, which protrusion is adapted to be engaged in the hole to be secured therein. This simple construction can realize the aforementioned distance control.

As a still further preferred feature, the deformative supporting part includes: a frame supporting plate, one end of the frame supporting plate being disposed in such a manner that the one end can turn in a direction away from the substrate, and the other end of the frame supporting plate being operative to support the frame; and a spring board member which contracts and deforms to warp itself, and applies a force, generated by the warp, to the frame supporting plate at a position thereof closer to the one end of the frame supporting plate than to its center, so as to turn the other end of the frame supporting plate in a direction away from the substrate, the spring board member supporting the frame supporting plate in such a turned position. With this arrangement, even if the warp width of the spring board member is limited to a small value, it is still possible to lift the frame by a greater amount than the warp width of the spring board member, utilizing the turning movement of the frame supporting plate.

In addition, the deformative supporting part can be a combination of the spring board member and the expansive member. This makes it possible to further increase the lift width by which the frame is lifted, with a simple construction.

Next, there is provided an optical switch with a micro mirror unit employed therein, the optical switch comprising: an optical input system including a plurality of input optical fibers connected thereamong in array form, the optical input system collimating incoming light input from the input optical fibers and outputting the collimated light; an optical output system including a plurality of output optical fibers connected thereamong in array form, the optical output system receiving the light output from the optical input system and outputting the received light to the output optical fibers; and a plurality of micro mirror units each of which selectively switches an individual optical path between the optical input system and the optical output system, each micro mirror unit including the foregoing constructions.

In the present optical switch with such a construction, it is possible to realize an enlarged mirror tilt angle of the micro mirror unit, without increasing the thickness of the sacrifice layer. This realizes a large optical path deflection angle, while avoiding deterioration in yields, so that a large-scale (with multiple channels) optical switch will be realized at low cost.

BRIEF DESCRIPTION OF THE DRAWINGS

FIG. 5A is a schematic top view of a micro tilt mirror according to a second embodiment of the present invention;
FIG. 5B is an A-A cross section of FIG. 5A;
FIG. 5C is a side view on arrow B of FIG. 5A;
FIG. 7A is a schematic top view of a micro tilt mirror according to a third embodiment of the present invention;
FIG. 7B is an A-A cross section of FIG. 7A;
FIG. 7C is a B-B cross section of FIG. 7A.

DESCRIPTION OF THE PREFERRED EMBODIMENTS

Embodiments of the present invention will now be described with reference to the accompanying drawings.

(A) Micro Mirror Unit (A1) First Embodiment

Figure 1A:
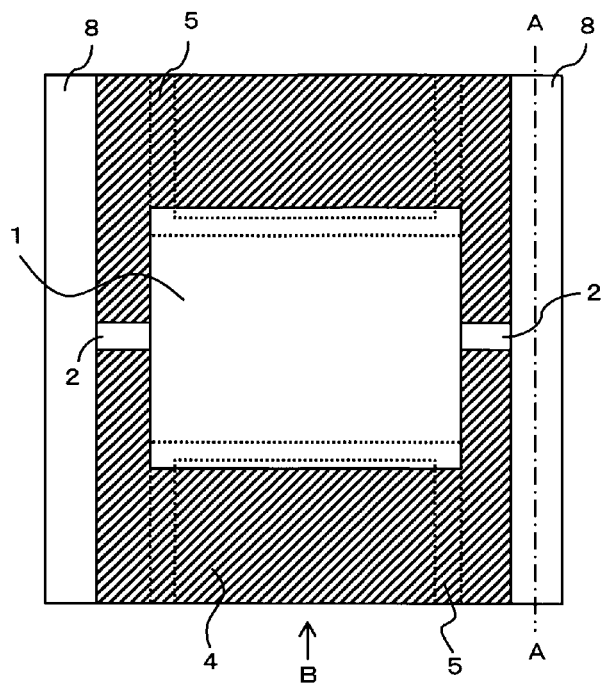
FIG. 1A is a schematic top view of a micro tilt mirror according to a first embodiment of the present invention.
Figure 1B:
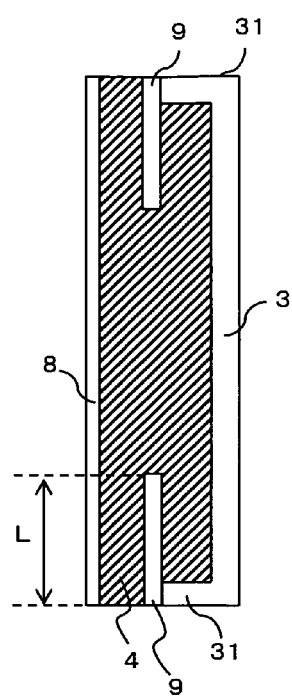
FIG. 1B is an A-A cross section of FIG. 1A.
Figure 1C:
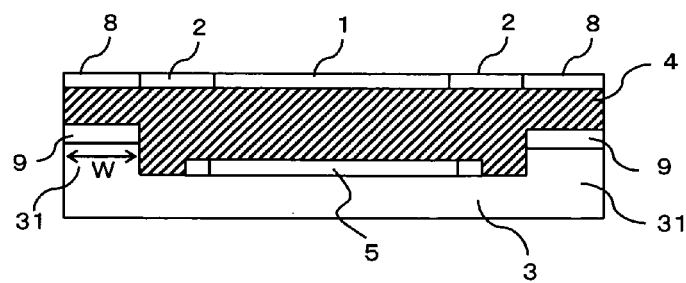
FIG. 1C is a side view on arrow B of FIG. 1A.

FIG. 1A schematically shows a top view of a micro tilt mirror of a first embodiment of the present invention. FIG. 1B is an A-A cross section of FIG. 1A; FIG. 1C is a side view on arrow B of FIG. 1A. As shown in FIG. 1A through FIG. 1C, an essential part of the micro tilt miller (micro mirror unit) of the first embodiment includes: a micro mirror 1 (hereinafter will be simply called the "mirror 1"); torsion bars 2; a bottom substrate 3 (hereinafter will be simply called the "substrate 3"), electrodes 5, frames 8, and spring boards 9. The reference number "4" designates a sacrifice layer that is to be removed ultimately. The sacrifice layer 4 securely holds and protects the mirror 1, torsion bars 2, electrodes 5, frames 8, and spring boards 9, until the layer is finally removed.

The mirror 1 reflects light. The torsion bars (mirror supporting bars) 2 support the mirror 1 and serve as the rotation axis of the mirror 1. The substrate 3, which is shaped like a letter U [with walls 31 (see FIG. 1B and FIG. 1C)], serves as the base of the micro tilt mirror. The electrodes 5 generate an electrostatic (electromagnetic) force which causes the mirror 1 to turn about the torsion bars 2.

In this example, the mirror 1 has a square shape with about 250 μm sides, and the substrate 3 also has a square shape with about 500 μm sides. Each torsion bar 2 has a cross section with a diameter of about 5 μm to 10 μm. Note that these measurements are just examples, and the sizes can be altered. In addition, the shape of the mirror 1 can be a round one (for example, see item 22A and 22B of FIG. 8).

Further, the frames 8 rotatably support the torsion bar 2. The spring boards (deformative supporting part; spring board member) 9 are disposed on the substrate 3 at four positions (its four corners) in this example, and one end of each of the spring boards 9 is fastened on top of a wall 31 of the substrate 3. After the sacrifice layer 4 is removed, the spring boards 9 develop contracting deformations (warps), whereby the other end of each spring board 9 lifts the frame 8 away from the substrate 3.

The dimensions (the width W of FIG. 1B and the length L of FIG. 1C, etc.) of the spring boards 9 are determined based on forces required to lift and support the frames 8, such that the spring boards 9 will be able to develop efficient warps to do so. Further, the width W of the spring boards 9 can be the same as or different from the width of the frames 8.

Figure 2:
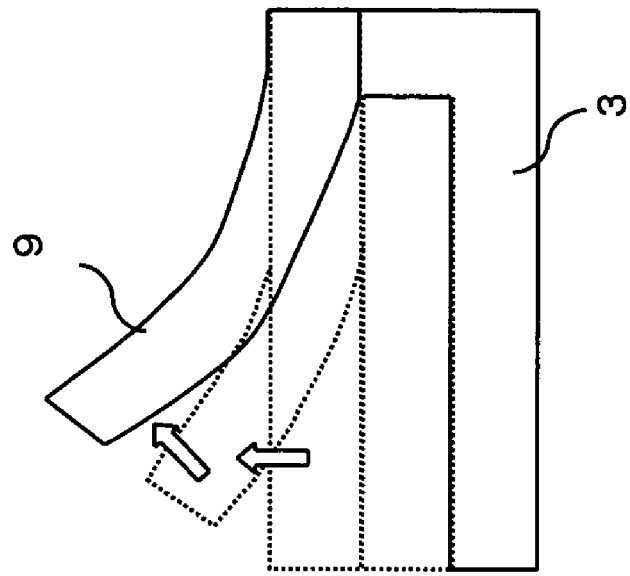
FIG. 2 is a schematic view describing a warp of a spring board of the first embodiment.
Figure 2:
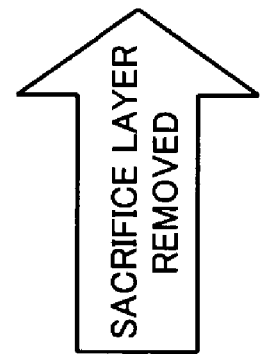
Figure 2:
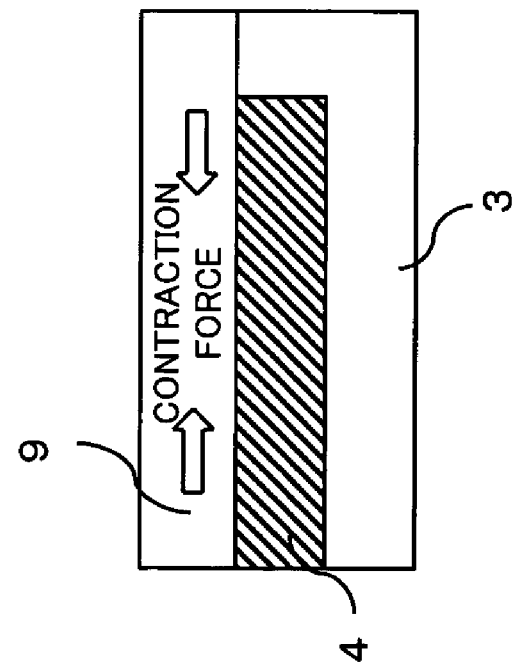

As shown in FIG. 2, after the sacrifice layer 4 is removed in the thus constructed micro tilt mirror, the spring boards 9 develop contracting deformation so as to warp themselves, whereby one end of the individual spring board 9 lifts the frame 8 away from substrate 3. This makes it possible to increase the distance between the mirror 1 and the substrate 3, without the necessity of increasing the thickness of the sacrifice layer, to realize a greater tilt angle for the mirror 1. It is thus possible to provide a micro tilt mirror having a desired mirror tilt angle, while avoiding deterioration in yields which is caused by any remains of the sacrifice layer.

Figure 3:
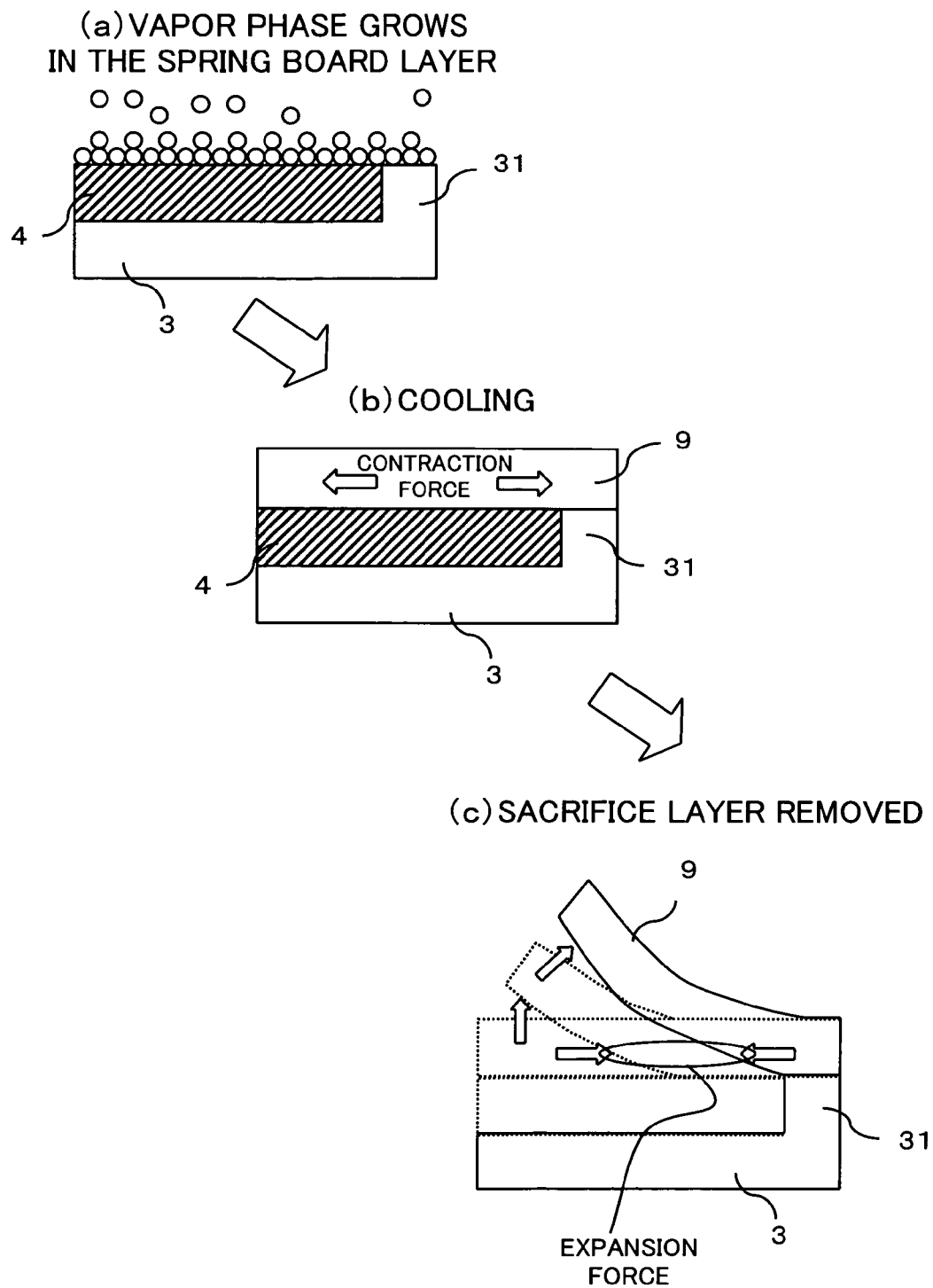
FIG. 3 is a schematic view describing the principle of the warp of the spring board of the first embodiment.

Here, the contracting deformation (warp) of the spring boards 9 is realized by providing the spring boards 9 with contractility, thereby causing crystal growth. More specifically, as shown in FIG. 3, for example, after a sacrifice layer 4 of silicon oxide ($SiO_2$) resin is formed on the substrate 3, silicon (Si) resin, which has been heated to high temperatures to be vaporized, is sprayed from over the sacrifice layer 4 so as to cause a vapor phase growth (a), whereby there is formed a silicon resin layer (a plastic resin layer which functions as a spring board 9) being thermally expanded (b). Here, the silicon resin layers 9 are fastened to the sacrifice layer 4 and the substrate 3 (wall 31).

After that, the whole of the above is cooled down to room temperature, whereby a contraction force is applied to the silicon resin layers 9 which were laminated while being thermally expanded. Therefore, when the sacrifice layer 4 is removed with a wet etching method or the like, the spring boards 9 bend upward (c), so that the frames 8 are lifted as shown in FIG. 2, thereby increasing the tilt angle of the micro mirror 1. After lamination of the sacrifice layer 4, the micro mirror 1, the torsion bars 2, and the frames 8 are formed on the sacrifice layer 4 with conventional procedures.

Here, when the frames 8 are lifted by utilizing the warp of the spring boards 9, controlling of the height by which the frames 8 are lifted becomes an issue. In particular, since this embodiment uses four spring boards 9 to lift the frames 8, the individual spring boards 9 must be bended upwards so that they will lift up the frame 8 by equal amounts. For this purpose, either or both of the frames 8 and the spring boards 9 are given a positioning mechanism formed thereon, which makes it possible to secure the frames 8 at a position a predetermined distance from the substrate 3.

Figure 4A:
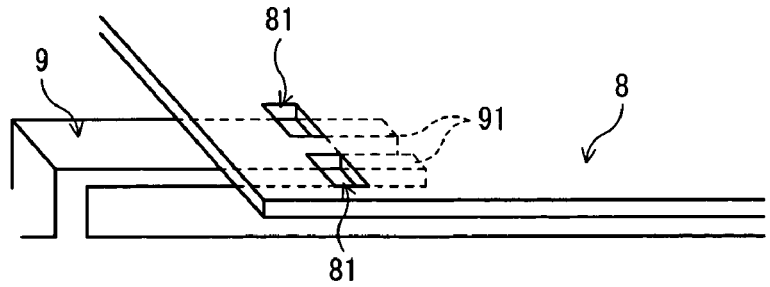
FIG. 4A, FIG. 4B, and FIG. 4C are schematic views describing a technique for fastening the spring board to a frame according to the first embodiment.
Figure 4B:
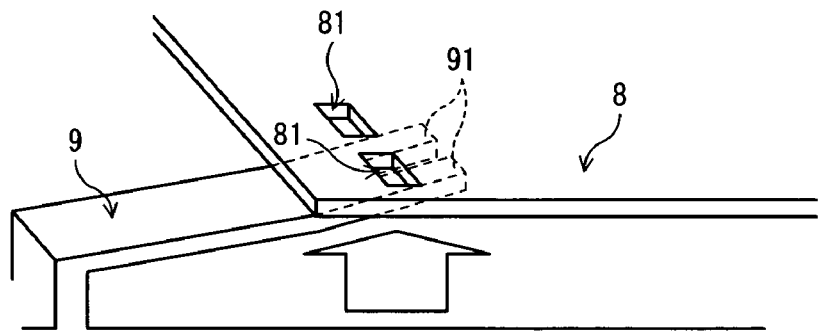
Figure 4C:
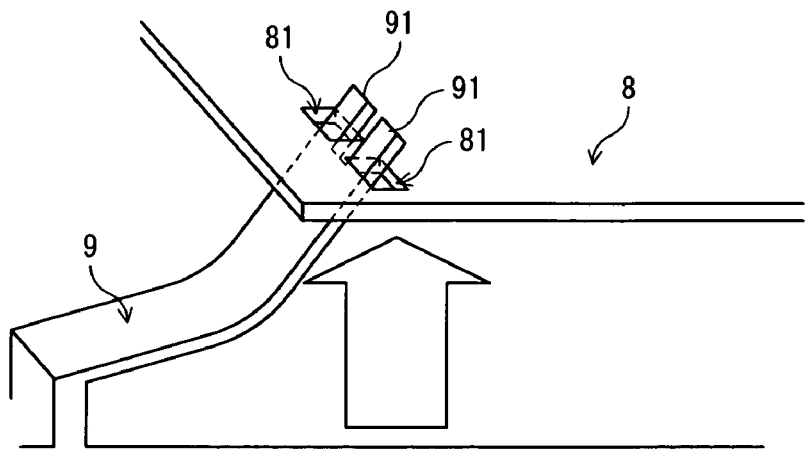

More precisely, as shown in the schematics of FIG. 4A through FIG. 4C, one tip of each spring board 9 is shaped like a letter U with protrusions 91, and the frame 8 has holes 81 formed thereon at specific positions, such that the protrusions 91 engage in the holes 81. With this arrangement, when the spring board 9 lifts up the frames 8, tips (protrusions 91) of the spring boards 9 engage in the holes 81 of the frame 8, thereby making it easy to control the height by which the micro mirror 1 is lifted. It is thus possible to horizontally lift the frame 8 to securely support the frame 8 at that position.

The shape of the positioning mechanism formed on the tips of the spring boards 9 can be varied. For example, the tip can have a convex shape. In this case, the frame 8 only needs to have a single hole 81 for each spring board 9. In addition, it is also possible to perform a similar height control with no forming of holes 81. For example, a groove in which the tip of each spring board 9 engages can be formed at a specific position on a contact surface of the frame 8 with the spring board 9. Further, it is also conceivable that a protrusion is formed at a specific position on a contact surface of the frame 8 with the spring board 9 to prevent the spring board 9 from bending beyond the protrusion.

(A2) Second Embodiment

FIG. 5A schematically shows a top view of a micro tilt mirror of a second embodiment of the present invention. FIG. 5B is an A-A cross section of FIG. 5A; FIG. 5C is a side view on arrow B of FIG. 5A. As shown in FIG. 5A through FIG. 5C, the difference in the micro tilt mirror between the second embodiment and the first embodiment is that the second embodiment has a frame supporting plate 10, a supporting member 11, and a hinge 12, for each spring board 9. Like reference numbers and characters designate similar parts or elements throughout several views of the present embodiment and the conventional art, so their detailed description is omitted here.

Figure 6A:
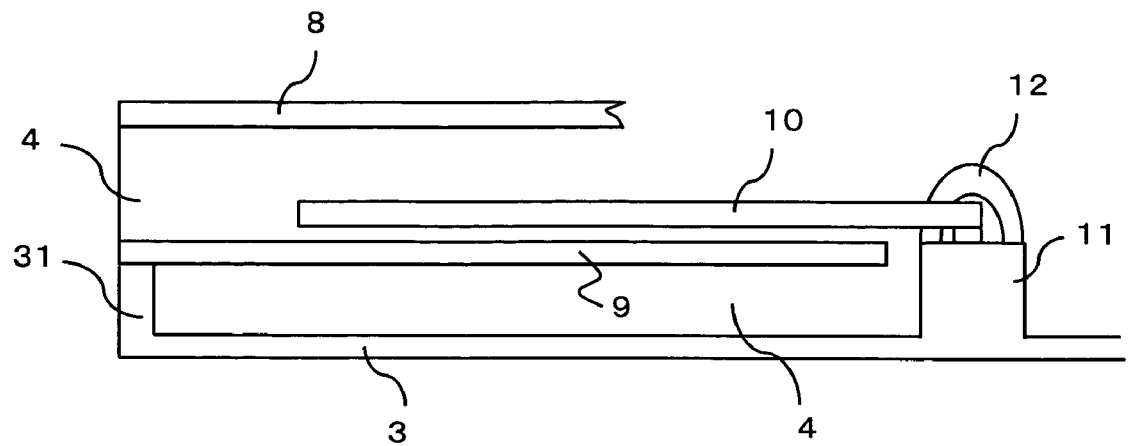
FIG. 6A and FIG. 6B are views describing a lift-up construction according to the second embodiment.

Here, each frame supporting plate 10, which has a similar shape to the spring board 9, has a hole (not illustrated) at one end of it. A ring-shaped stopper passes through the hole, to hold the frame supporting plate 10 onto the supporting member 11 in such a manner that the frame supporting plate 10 can turn in a direction away from the substrate 3. As shown in FIG. 5B and FIG. 6A, the supporting member 11 is disposed opposite the wall 31 on the substrate 3 in such a manner that the free ends of the spring board 9 and of the frame supporting plate 10 are staggered.

With this arrangement, as in the case of the first embodiment, when the spring board 9 warps due to a contraction force caused at removal of the sacrifice layer 4, a tip of the spring board 9 touches the frame supporting plate 10, whereby the warp force is transferred to (acts on) the frame supporting plate 10 at a position that is closer, in the lengthwise direction thereof, to the hinge 12 than to the center.

Figure 6B:
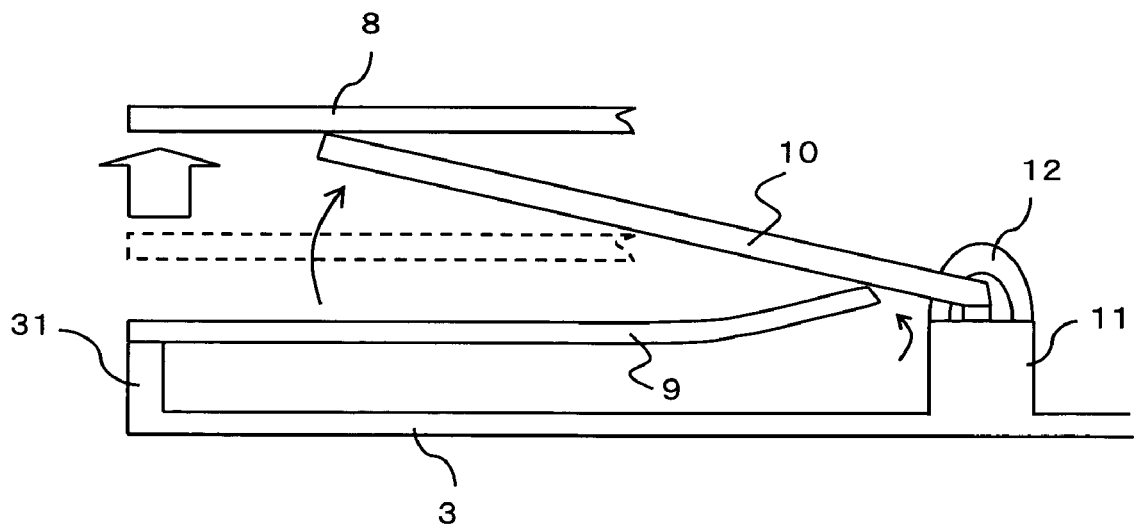

As a result, as shown in the schematic of FIG. 6B, the other end of the frame supporting plate 10 moves along the arc of a circle whose center is the hinge 12, in the direction such that the end moves away from the substrate 3. This movement of the frame supporting plate 10 lifts the frame 8 in the direction such that the frame 8 moves away from the substrate 3. That is, in this embodiment, the spring board 9 and the frame supporting plate 10 in combination function as a deformative supporting part which deforms itself to lift the frame 8 in the direction such that the frame 8 moves away from the substrate, and which supports the frame 8 in such a lifted condition.

In this example, since the point of action of the warp force of the spring board 9 to the frame supporting plate 10 is close to the hinge 12, the frame supporting plate 10 is capable of turning by a greater amount in comparison with the warp width of the spring board 9, so that the frame 8 is also lifted by a greater amount than the warp width of the spring board 9. Therefore, even if the warp width of the spring board 9 is limited to a small value, it is still possible to lift the frame 8 by a greater amount than the warp width of the spring board 9, thereby realizing a desired mirror tilt angle.

Further, the lengths (the widthwise length of the paper sheets of FIG. 6A and FIG. 6B) of the spring board 9 and the frame supporting plate 10 can be the same or different. However, shorter spring boards 9 will improve the supporting ability of the frame supporting plate 10. The connection construction by use of the hinge 12 can be replaced by any other equivalent construction, as far as it realizes the above-described functions. Further, it is possible to control the height by which the frame 8 is lifted, by using the same positioning mechanism as in the first embodiment. In this case, the positioning mechanism can be provided for any of the frame 8, the spring board 9, and the frame supporting plate 10.

(A3) Third Embodiment

FIG. 7A schematically shows a top view of a micro tilt mirror of a third embodiment of the present invention. FIG. 7B is an A-A cross section of FIG. 7A; FIG. 7C is a B-B cross section of FIG. 7A. As shown in FIG. 7A through FIG. 7C, the difference between the micro tilt mirror of the third embodiment and the one already described referring to FIG. 1A through FIG. 1C lies in that an expansion block (expansive member) 13 is provided on the substrate 3, and that the spring board 9 is disposed in contact with this expansion block 13. Like reference numbers and characters designate similar parts or elements throughout several views of the present embodiment and the conventional art, so their detailed description is omitted here.

Here, the expansion block 13 expands (for example, due to thermal expansion), thereby deforming itself, to lift the spring board 9 away from the substrate 3 and support the spring board 9 in the lifted condition. That is, in this embodiment, the spring board 9 and the expansion block 13 in combination function as a deformative supporting part which deforms to lift the frame 8 in the direction such that the frame 8 moves away from the substrate, and supports the frame 8 in such a lifted condition. Here, it is preferred that the expansion block 13 is made of a resinous material (for example, polymide) with a large expansion coefficient, and any other material that can be expanded after removal of the sacrifice layer 4 is also applicable.

With this arrangement, the expansion block 13 expands, thereby warping the spring board 9, after removal of the sacrifice layer 4. It is thus possible to lift the frame 8 away from the substrate 3 and to support the frame 8 in the lifted condition, with a simple construction. In this case, also, it is possible to realize a desired mirror tilt angle without thickening the sacrifice layer. Here, a normal supporting board having no contractility is applicable, in place of the spring board 9. Further, the expansion block 13 can directly lift the frame 8. In any of the cases, it is possible to realize a large mirror tilt angle with a simple construction, without increasing the thickness of the sacrifice layer.

(B) Optical Switch

Next, a description will be made hereinbelow of an optical switch with the above-described micro tilt mirrors employed therein.

Figure 8:
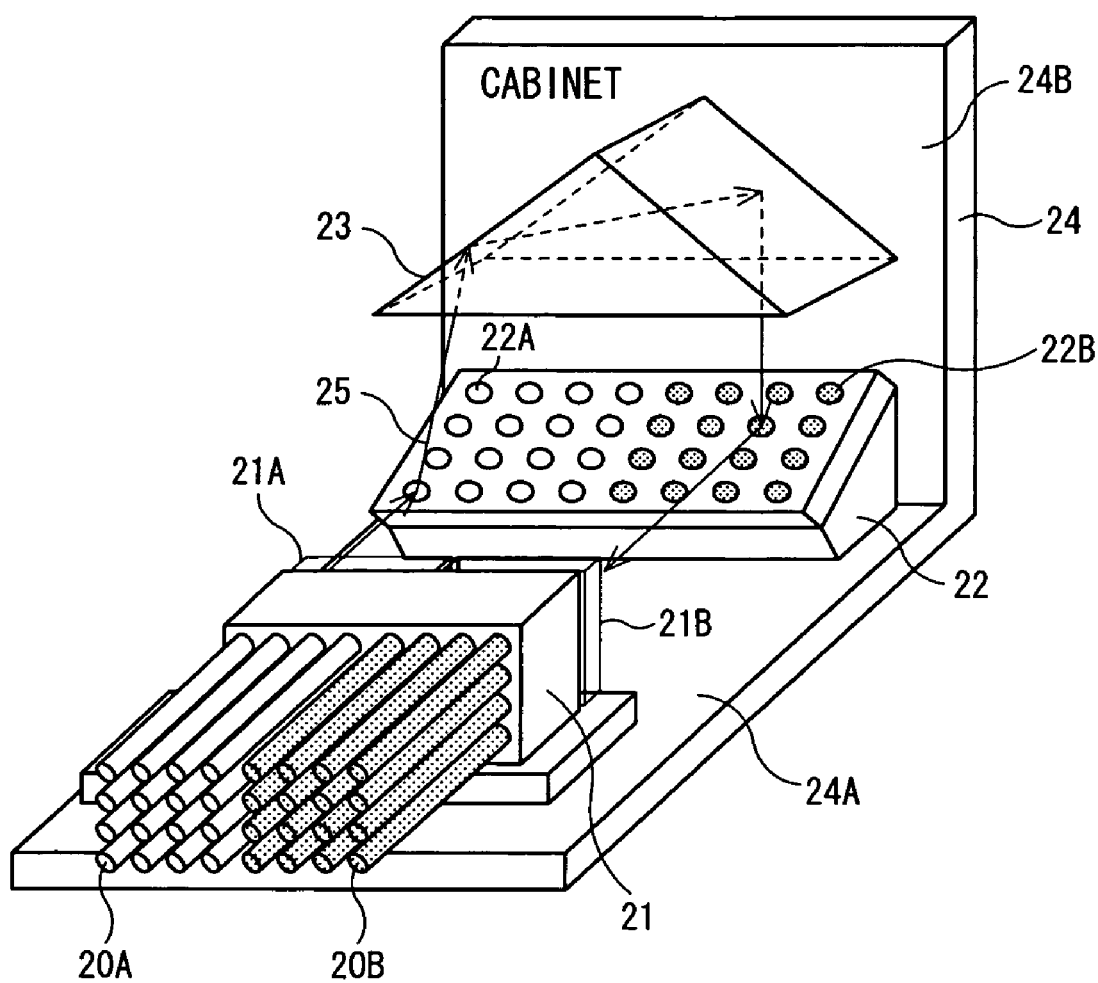
FIG. 8 is a perspective diagram of a construction of an optical switch with micro tilt mirrors of the present invention employed therein.
Figure 9A:
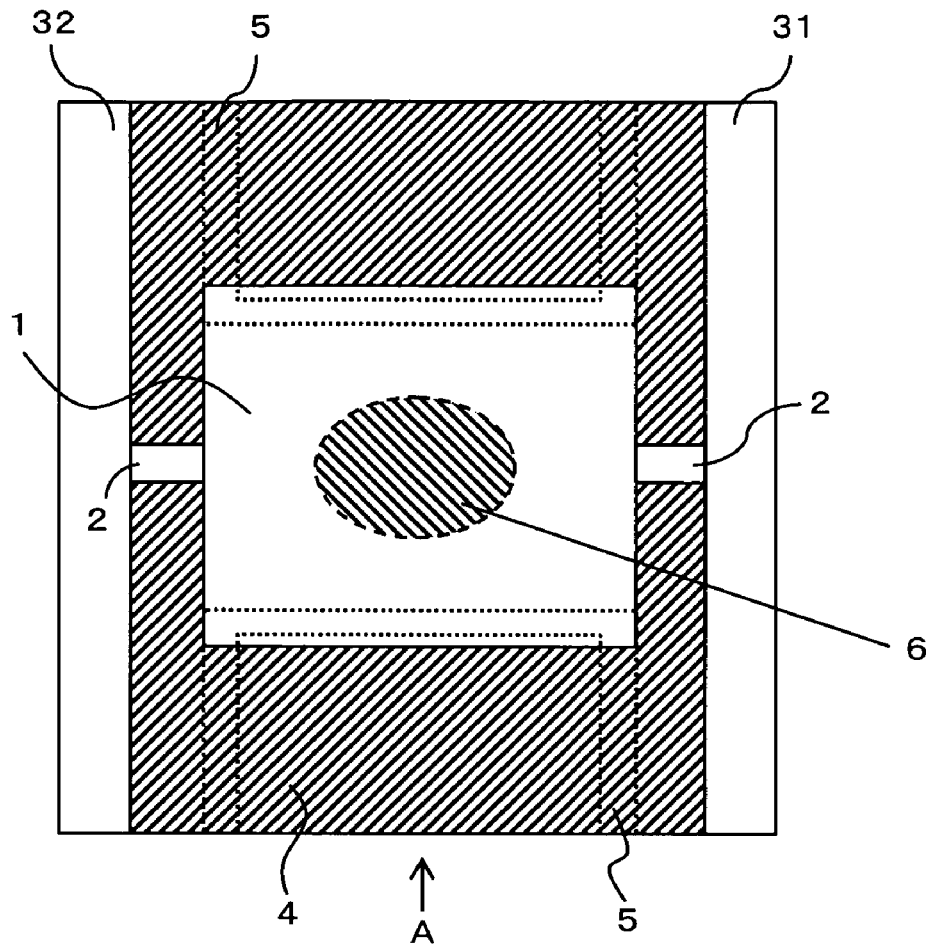
FIG. 9A is a schematic top view of a previous micro tilt mirror.
Figure 9B:
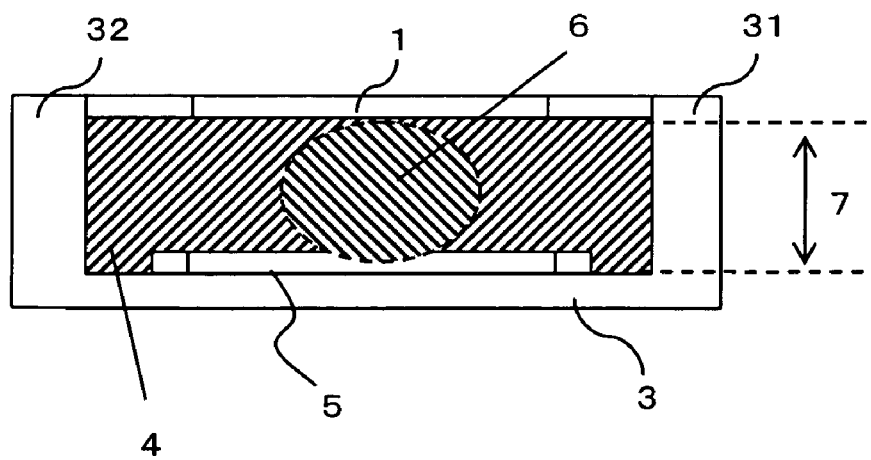
FIG. 9B is a side view on arrow A of FIG. 9A.
Figure 10:
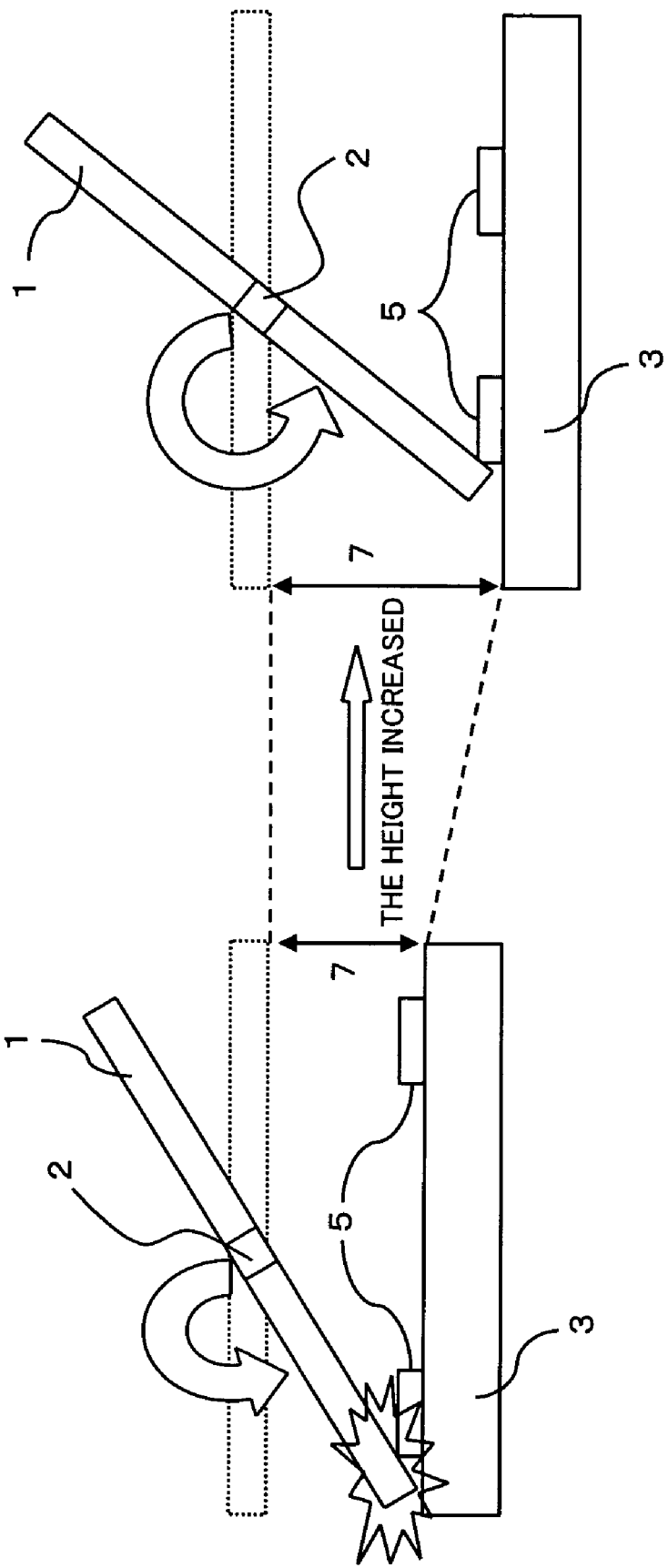
FIG. 10 is a view describing a problem accompanying the previous micro tilt mirror.

FIG. 8 is a perspective diagram of a construction of an optical switch with micro tilt mirrors in the above description employed therein. The optical switch of FIG. 8 has a cabinet 24 shaped like a letter L (with a horizontal side 24A and a vertical side 24B), on which cabinet 24 there are arranged an I/O integrated fiber block 21 in which an optical input system 21A and an optical output system 21B are integrated. In addition, a corner mirror 23 is provided on the vertical side 24B of the cabinet 24 at a specific position, and a micro mirror array block 22 is provided at the intersection of the horizontal side 24A and the vertical side 24B.

The optical input system (input collimator) 21A, which includes two or more (here, 16) input optical fibers 20A connected thereamong in array form, collimates incoming light input from the input optical fibers 20A and then outputs the collimated light. The optical output system (output collimator) 21B, which includes two or more (here, 16) output optical fibers 20B connected thereamong in array form, receives the light output from the optical input system 21A and outputs the received light to the output optical fibers 20B.

The micro mirror array block 22 includes input micro tilt mirrors 22A (hollow circles in FIG. 8), whose number is equal to the number of the input optical fibers 20A coming into the input collimator 21A, and also output micro tilt mirrors 22B (shaded circles in FIG. 8), whose number is equal to the number of the output optical fibers 20B coming into the output collimator 21B, both the input micro tilt mirrors 22A and the output micro tilt mirrors 22B being arranged in array form according to the arrangement of the optical fibers 20A and 20B. The light beams output from the input collimator 21A are reflected by the input micro tilt mirrors 22A to the corner mirror 23, and the light reflected from the corner mirror 23 is then reflected by the output micro tilt mirrors 22B to the output collimator 21B, so that light beams are transferred though the space, along an optical path as shown by arrow 25, for example, in FIG. 8.

Since the mirror tilt angles of the individual micro tilt mirrors 22A and 22B are controlled separately, it is possible to arbitrarily select and spatially change optical paths 25 between the input collimator 21A (input optical fibers 20A) and the output collimator 21B (output optical fibers 20B). As a result, a spatial optical switch is realized in which optical crossconnect with a scale (16 channels by 16 channels in FIG. 8) corresponding to the number of employed micro tilt mirrors is available.

Each of the micro tilt mirrors 22A and 22B includes a construction (with spring board 9 or the like) for lifting up the mirror 1 as described above. By applying micro tilt mirrors with the above-described lifting-up construction to an optical switch, it is possible to enlarge the mirror tilt angles of the micro tilt mirrors 22A and 22B without increasing the thickness of the sacrifice layer. This realizes an enlarged optical path switching width, while avoiding deterioration in yields which is caused by remains of the sacrifice layer, so that a large-scale (with multiple channels) optical switch will be realized at low cost.

In the above example, the input collimator 21A and the output collimator 21B are integrated (this facilitates accurate adjustment of optical axes), but alternatively, they can be arranged as separate units at different positions (for example, at positions opposite each other). Further, the input collimator 21A and the output collimator 21B can have existing constructions. In addition, in the above example, the micro tilt mirrors with the lift-up construction are applied to an optical switch, and such tilt mirrors are also applicable to other devices (for example, display devices) than optical switches.

Further, the present invention should by no means be limited to the above-illustrated embodiment, but various changes or modifications may be suggested without departing from the gist of the invention.

The present invention realizes a micro mirror unit which provides an enlarged mirror tilt angle without increasing the thickness of the sacrifice layer, so that it is not only possible to avoid deterioration in yields in the micro mirror unit, but it is also possible to realize with ease a large-scale optical switch. The invention is thus considered to be greatly useful in the field of optical transmission technology.

What is claimed is:

1. A micro mirror unit, comprising:
    a substrate;
    on the surface of said substrate,
    a micro mirror that reflects light;
    a torsion bar that supports said micro mirror;
    a frame that rotatably supports said torsion bar; and
    a deformative supporting part that is disposed between said substrate and said frame and that deforms to lift said frame away from said substrate after removal of a sacrifice layer formed between said substrate and said frame, said deformative supporting part supporting said frame in such lifted condition.

2. A micro mirror unit as set forth in claim 1, wherein said deformative supporting part includes a spring board member which contracts and deforms to warp itself so as to lift said frame away from said substrate, said spring board member supporting said frame in such lifted condition.

3. A micro mirror unit as set forth in claim 1, wherein said deformative supporting part includes an expansive member which expands and deforms so as to lift said frame away from said substrate, said expansive member supporting said frame in such lifted condition.

4. A micro mirror unit as set forth in claim 1, wherein said deformative supporting part includes:
    a spring board member which contracts and deforms to warp itself so as to lift said frame away from said substrate, said spring board member supporting said frame in such lifted condition; and
    an expansive member which expands and deforms so as to lift said spring board member away from said substrate, said expansive member supporting said spring board member in such lifted condition.

5. A micro mirror unit as set forth in claim 2, wherein either one or both of said frame and said spring board member have a positioning mechanism formed thereon, the positioning mechanism being operative to secure said frame at a position apart from said substrate by a specific distance.

6. A micro mirror unit as set forth in claim 4, wherein either one or both of said frame and said spring board member have a positioning mechanism formed thereon, the positioning mechanism being operative to secure said frame at a position apart from said substrate by a specific distance.

7. A micro mirror unit as set forth in claim 5, wherein said positioning mechanism is a combination of a hole formed on said frame and a protrusion that is adapted to be engaged in the hole to be secured therein.

8. A micro mirror unit as set forth in claim 6, wherein said positioning mechanism is a combination of a hole formed on said frame and a protrusion that is adapted to be engaged in the hole to be secured therein.

9. A micro mirror unit as set forth in claim 1, wherein said deformative supporting part includes:
    a frame supporting plate, one end of said frame supporting plate being disposed in such a manner that the one end can turn in a direction separating from said substrate, and the other end of said frame supporting plate being operative to support said frame; and
    a spring board member which contracts and deforms to warp itself, and applies a force, generated by the warp, to said frame supporting plate at a position thereof closer to said one end of said frame supporting plate than to its center, so as to turn said other end of said frame supporting plate in a direction separating from said substrate, said spring board member supporting said frame supporting plate in such turned position.

10. A manufacturing process for a micro mirror unit, comprising:
    forming, on a substrate, a resin layer with plasticity and a sacrifice layer with a specific thickness in this order;
    forming, on the sacrifice layer, a micro mirror that reflects light, a torsion bar that supports the micro mirror, and a frame that rotatably supports the torsion bar; and
    removing the sacrifice layer to deform the resin layer so that the resin layer lifts the frame away from the substrate and supports the frame in such lifted condition.

11. An optical switch with a micro mirror unit employed therein, said optical switch comprising:
    an optical input system that includes a plurality of input optical fibers connected thereamong in array form, said optical input system collimating incoming light input from the input optical fibers and outputting the collimated light;
    an optical output system that includes a plurality of output optical fibers connected thereamong in array form, said optical output system receiving the light output from said optical input system and outputting the received light to the output optical fibers; and
    a plurality of micro mirror units each of which selectively switches an individual optical path between said optical input system and said optical output system,
    each said micro mirror unit including:
        a substrate;
        on the surface of said substrate,
            a micro mirror that reflects light;
            a torsion bar that supports said micro mirror;
            a frame that rotatably supports said torsion bar; and
            a deformative supporting part that is disposed between said substrate and said frame and that deforms to lift said frame away from said substrate after removal of a sacrifice layer formed between said substrate and said frame, said deformative supporting part supporting said frame in such lifted condition.

12. An optical switch with a micro mirror unit employed therein as set forth in claim 11, wherein said deformative supporting part includes a spring board member which contracts and deforms to warp itself so as to lift said frame away from said substrate, said spring board member supporting said frame in such lifted condition.

13. An optical switch with a micro mirror unit employed therein as set forth in claim 11, wherein said deformative supporting part includes an expansive member which expands and deforms so as to lift said frame away from said substrate, said expansive member supporting said frame in such lifted condition.

14. An optical switch with a micro mirror unit employed therein as set forth in claim 11, wherein said deformative supporting part includes:
    a spring board member which contracts and deforms to warp itself so as to lift said frame away from said substrate, said spring board member supporting said frame in such lifted condition; and
    an expansive member which expands and deforms so as to lift said spring board member away from said substrate, said expansive member supporting said spring board member in such lifted condition.

15. An optical switch with a micro mirror unit employed therein as set forth in claim 12, wherein either one or both of said frame and said spring board member have a positioning mechanism formed thereon, the positioning mechanism being operative to secure said frame at a position apart from said substrate by a specific distance.

16. An optical switch with a micro mirror unit employed therein as set forth in claim 14, wherein either one or both of said frame and said spring board member have a positioning mechanism formed thereon, the positioning mechanism being operative to secure said frame at a position apart from said substrate by a specific distance.

17. An optical switch with a micro mirror unit employed therein as set forth in claim 15, wherein said positioning mechanism is a combination of a hole formed on said frame and a protrusion that is adapted to be engaged in the hole to be secured therein.

18. An optical switch with a micro mirror unit employed therein as set forth in claim 16, wherein said positioning mechanism is a combination of a hole formed on said frame and a protrusion that is adapted to be engaged in the hole to be secured therein.

19. An optical switch with a micro mirror unit employed therein as set forth in claim 11, wherein said deformative supporting part includes:
   a frame supporting plate, one end of said frame supporting plate being disposed in such a manner that the one end can turn in a direction separating from said substrate, and the other end of said frame supporting plate being operative to support said frame; and
   a spring board member which contracts and deforms to warp itself, and applies a force, generated by the warp, to said frame supporting plate at a position thereof closer to said one end of said frame supporting plate than to its center, so as to turn said other end of said frame supporting plate in a direction separating from said substrate, said spring board member supporting said frame supporting plate in such turned position.

* * * * *

UNITED STATES PATENT AND TRADEMARK OFFICE
CERTIFICATE OF CORRECTION

PATENT NO. : 7,982,937 B2
APPLICATION NO. : 10/953619
DATED : July 19, 2011
INVENTOR(S) : Shinichi Takeuchi and Tsuyoshi Yamamoto It is certified that error appears in the above-identified patent and that said Letters Patent is hereby corrected as shown below:

Title Page, insert the following:

--(63) Related U.S. Application Data: Continuation of Application No. PCT/JP2002/006229, filed on June 21, 2002.--.

Signed and Sealed this
Tenth Day of January, 2012

David J. Kappos
*Director of the United States Patent and Trademark Office*